United States Patent
Wu et al.

(10) Patent No.: US 10,937,721 B2
(45) Date of Patent: Mar. 2, 2021

(54) SEMICONDUCTOR STRUCTURE

(71) Applicant: TAIWAN SEMICONDUCTOR MANUFACTURING COMPANY LTD., Hsinchu (TW)

(72) Inventors: Jiun-Yi Wu, Taoyuan County (TW); Chen-Hua Yu, Hsinchu (TW); Chung-Shi Liu, Hsinchu (TW); Chien Hsun Lee, Hsin-Chu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/567,692

(22) Filed: Sep. 11, 2019

(65) Prior Publication Data
US 2020/0006208 A1    Jan. 2, 2020

Related U.S. Application Data

(63) Continuation of application No. 15/681,776, filed on Aug. 21, 2017, now Pat. No. 10,461,022.

(51) Int. Cl.
*H01L 23/498* (2006.01)
*H01L 23/16* (2006.01)
(Continued)

(52) U.S. Cl.
CPC ........ *H01L 23/49816* (2013.01); *H01L 23/04* (2013.01); *H01L 23/16* (2013.01);
(Continued)

(58) Field of Classification Search
CPC ............... H01L 23/5226; H01L 23/538; H01L 23/5389; H01L 23/49816; H01L 24/09;
(Continued)

(56) References Cited

U.S. PATENT DOCUMENTS 10,461,022 B2 * 10/2019 Wu ................... H01L 23/49816
2014/0300004 A1 * 10/2014 Choi ..................... H01L 21/561
257/774

(Continued)

OTHER PUBLICATIONS

Office Action dated Oct. 30, 2020 from Taiwan Patent Office for Application No. 106141665.

*Primary Examiner* — Thanh Y. Tran
(74) *Attorney, Agent, or Firm* — WPAT, P.C., Intellectual Property Attorneys; Anthony King

(57) ABSTRACT

A semiconductor structure includes a first die, a molding at least partially surrounding the first die, a via extended through the molding, a second die disposed over the molding, a connector dispose between the second die and the via, and an underfill at least partially surrounding the connector. The first die includes a first surface and a second surface opposite to the first surface. The second die includes a third surface facing the first die, a fourth surface opposite to the third surface, and a sidewall between the third surface and the fourth surface. The connector is in contact with the third surface of the second die and the via. The second die is electrically connected to the via. The underfill covers a portion of the sidewall of the second die and a portion of the second surface of the first die.

20 Claims, 12 Drawing Sheets

(51) Int. Cl.
    *H01L 23/00*     (2006.01)
    *H01L 23/522*     (2006.01)
    *H01L 25/00*     (2006.01)
    *H01L 25/065*     (2006.01)
    *H01L 25/10*     (2006.01)
    *H01L 23/04*     (2006.01)
    *H01L 23/538*     (2006.01)
    H01L 23/367     (2006.01)
    H01L 21/48     (2006.01)

(52) U.S. Cl.
    CPC .... *H01L 23/49811* (2013.01); *H01L 23/5226* (2013.01); *H01L 23/5385* (2013.01); *H01L 24/03* (2013.01); *H01L 24/09* (2013.01); *H01L 24/17* (2013.01); *H01L 25/0652* (2013.01); *H01L 25/105* (2013.01); *H01L 25/50* (2013.01); *H01L 21/486* (2013.01); *H01L 23/3675* (2013.01); *H01L 23/5384* (2013.01); *H01L 24/13* (2013.01); *H01L 24/16* (2013.01); *H01L 24/32* (2013.01); *H01L 24/73* (2013.01); *H01L 24/92* (2013.01); *H01L 2224/131* (2013.01); *H01L 2224/13014* (2013.01); *H01L 2224/13144* (2013.01); *H01L 2224/13147* (2013.01); *H01L 2224/13155* (2013.01); *H01L 2224/16227* (2013.01); *H01L 2224/16235* (2013.01); *H01L 2224/32225* (2013.01); *H01L 2224/73204* (2013.01); *H01L 2224/73253* (2013.01); *H01L 2224/81005* (2013.01); *H01L 2224/83005* (2013.01); *H01L 2224/92125* (2013.01); *H01L 2224/97* (2013.01); *H01L 2225/06517* (2013.01); *H01L 2225/06562* (2013.01); *H01L 2225/06589* (2013.01); *H01L 2225/1023* (2013.01); *H01L 2225/1058* (2013.01); *H01L 2225/1094* (2013.01); *H01L 2924/1431* (2013.01); *H01L 2924/1432* (2013.01); *H01L 2924/1433* (2013.01); *H01L 2924/15311* (2013.01); *H01L 2924/15313* (2013.01); *H01L 2924/16153* (2013.01); *H01L 2924/16251* (2013.01); *H01L 2924/18161* (2013.01)

(58) Field of Classification Search
    CPC ..... H01L 24/17; H01L 24/18; H01L 2224/97; H01L 2224/73204; H01L 25/043; H01L 25/0657; H01L 25/074; H01L 25/0756; H01L 25/117
    See application file for complete search history.

(56) References Cited

U.S. PATENT DOCUMENTS

| | | | |
|---|---|---|---|
| 2014/0340849 | A1 | 11/2014 | Kim |
| 2015/0206865 | A1* | 7/2015 | Yu .............. H01L 21/56 |
| | | | 257/737 |
| 2015/0206866 | A1* | 7/2015 | Yu .............. H01L 25/18 |
| | | | 257/738 |
| 2017/0062384 | A1 | 3/2017 | Lee et al. |
| 2017/0117260 | A1 | 4/2017 | Prabhu et al. |
| 2018/0068978 | A1* | 3/2018 | Jeng .............. H01L 24/02 |
| 2018/0138130 | A1* | 5/2018 | Lin ............... H01L 23/552 |

* cited by examiner

SEMICONDUCTOR STRUCTURE

PRIORITY CLAIM AND CROSS-REFERENCE

This application is a continuation of U.S. patent application Ser. No. 15/681,776, filed on Aug. 21, 2017, entitled of "SEMICONDUCTOR PACKAGE STRUCTURE AND MANUFACTURING METHOD THEREOF", the disclosure of which is hereby incorporated by reference in its entirety.

BACKGROUND

Electronic equipments using semiconductor devices are essential for many modern applications. With the advancement of electronic technology, the semiconductor devices are becoming increasingly smaller in size while having greater functionality and greater amounts of integrated circuitry. Due to the miniaturized scale of the semiconductor device, a system in package (SiP) is widely used for its low cost and relatively simple manufacturing operations. During the SiP operation, a number of semiconductor components are assembled on the semiconductor device. Furthermore, numerous manufacturing operations are implemented within such a small semiconductor device.

However, the manufacturing operations of the semiconductor device involve many steps and operations on such a small and thin semiconductor device. The manufacturing of the semiconductor device in a miniaturized scale becomes more complicated. An increase in a complexity of manufacturing the semiconductor device may cause deficiencies such as poor electrical interconnection, delamination of components, or other issues, resulting in a high yield loss of the semiconductor device. As such, there are many challenges for modifying a structure of the semiconductor devices and improving the manufacturing operations.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
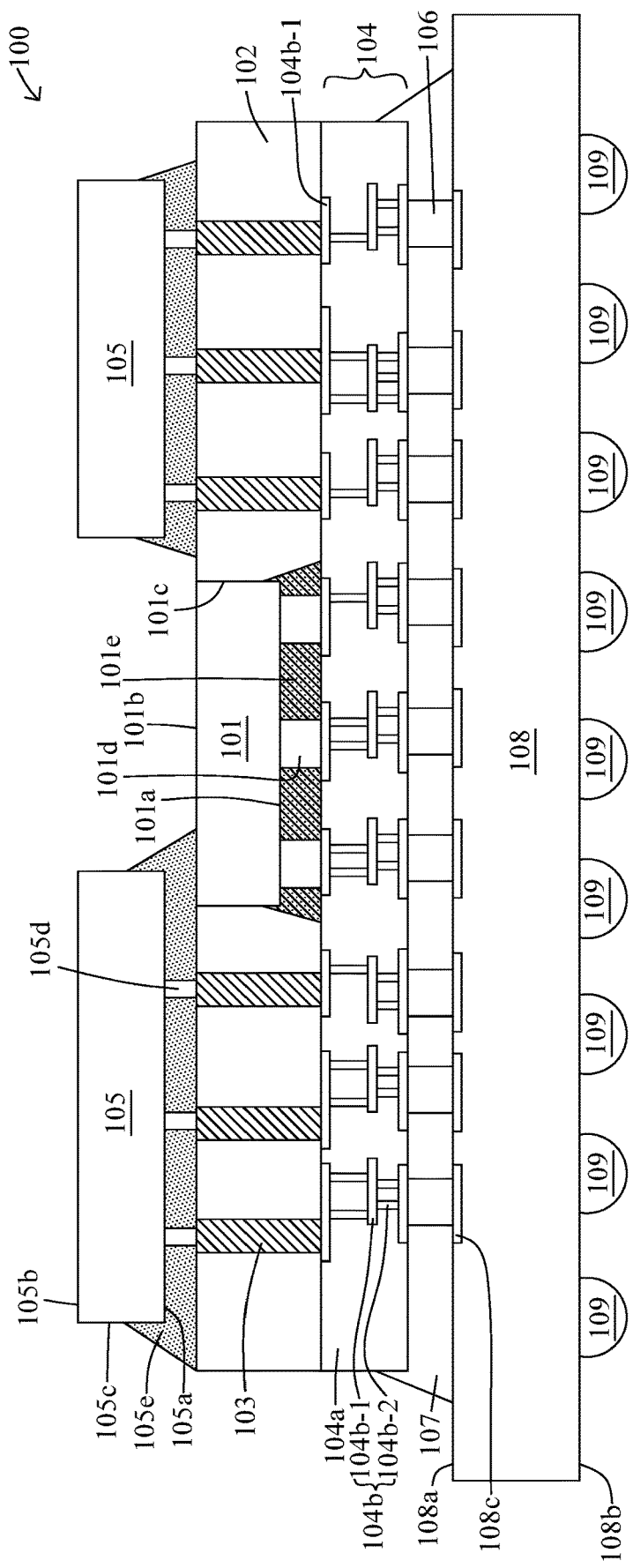
FIG. 1 is a schematic cross sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

A die is fabricated and singulated from a semiconductive wafer. After singulation, the die is packaged to become a semiconductor package and integrated with another die or package. The die is encapsulated by a molding, and I/O terminals of the die are routed out through conductive lines disposed within a dielectric layer, and the die is electrically connected to another dies or packages by a connector between the dies or packages. However, such configuration may not satisfy a high demand on electrical communication speed between dies, heat dissipation from dies, etc. As a result, performance of dies or packages may not be at a desired level.

In the present disclosure, a semiconductor structure is disclosed. The semiconductor structure includes a first die disposed over an interconnect structure, a molding surrounding the first die, a second die disposed over the molding, and a via extended through the molding. The second die is disposed over the first die and electrically connected with the first die through the via. As such, routing between the first die and the second die is minimized, and thus electrical communication speed between the first die and the second die can be increased and operation power can be decreased. Further, an overall dimension of the semiconductor structure can also be minimized.

FIG. 1 is a schematic cross sectional view of a semiconductor structure 100 in accordance with various embodiments of the present disclosure. In some embodiments, the semiconductor structure 100 includes a first die 101, a molding 102, a via 103, an interconnect structure 104 and a second die 105.

In some embodiments, the semiconductor structure 100 is a semiconductor package. In some embodiments, the semiconductor structure 100 is an integrated fan out (InFO) package, where I/O terminals of the first die 101 is fanned out and redistributed over a surface of the first die 101 in a greater area. In some embodiments, the semiconductor structure 100 is a chip on chip or package on package (PoP), such that chips or packages are stacked over each other. In some embodiments, the semiconductor structure 100 is a system on integrated chips (SoIC) packaging structure. In some embodiments, the semiconductor structure 100 is a three dimensional integrated circuit (3D IC).

In some embodiments, the first die 101 is fabricated with a predetermined functional circuit within the first die 101. In some embodiments, the first die 101 is singulated from a semiconductive wafer by a mechanical or laser blade. In some embodiments, the first die 101 comprises a variety of electrical circuits suitable for a particular application. In some embodiments, the electrical circuits include various devices such as transistors, capacitors, resistors, diodes and/or the like.

In some embodiments, the first die 101 comprises of any one of various known types of semiconductor devices such as microprocessors, application-specific integrated circuits (ASICs), or the like. In some embodiments, the first die 101 is a logic device die, central processing unit (CPU) die, or the like. In some embodiments, the first die 101 is a system on chip (SOC) that integrates all electronic components into a single die. In some embodiments, the first die 101 is a die, a chip or a package. In some embodiments, the first die 101 has a top cross section (a cross section from a top view of the semiconductor structure 100 as shown in FIG. 1) in a quadrilateral, a rectangular or a square shape.

In some embodiments, the first die 101 includes a substrate which comprises semiconductive materials such as silicon. In some embodiments, the substrate of the first die 101 includes several circuitries and electrical components disposed thereon. In some embodiments, the substrate of the first die 101 is a silicon substrate.

In some embodiments, the first die 101 includes a first surface 101a, a second surface 101b opposite to the first surface 101a, and a sidewall 101c between the first surface 101a and the second surface 101b. In some embodiments, the first surface 101a is a front side or active side of the first die 101. In some embodiments, the second surface 101b is a back side or inactive side of the first die 101. In some embodiments, the sidewall 101c is substantially orthogonal to the first surface 101a and the second surface 101b. In some embodiments, the sidewall 101c is vertically extended between the first surface 101a and the second surface 101b.

In some embodiments, a first connector 101d is disposed over or below the first die 101. In some embodiments, the first connector 101d is disposed over or below the first surface 101a of the first die 101. In some embodiments, the first connector 101d is protruded from the first die 101. In some embodiments, the first connector 101d is electrically connected to a circuitry in the first die 101. In some embodiments, the first connector 101d is configured to couple with a circuitry or a conductive structure external to the first die 101. In some embodiments, the first connector 101d includes conductive material such as includes solder, copper, nickel, gold or etc. In some embodiments, the first connector 101d is a conductive bump, a solder ball, a ball grid array (BGA) ball, controlled collapse chip connection (C4) bump, microbump, a pillar, a post or the like. In some embodiments, the first connector 101d is in a spherical, hemispherical or cylindrical shape.

In some embodiments, a first underfill 101e surrounds the first connector 101d and partially surround the first die 101. In some embodiments, the first underfill 101e is in contact with the first surface 101a, the sidewall 101c of the first die 101 and the first connector 101d. In some embodiments, a portion of the sidewall 101c of the first die 101 is covered by the first underfill 101e, and a portion of the sidewall 101c of the first die 101 is exposed from the first underfill 101e. In some embodiments, the first underfill 101e fills gap between the first connectors 101d. In some embodiments, the first underfill 101e is an electrically insulated adhesive for securing a bonding between the first die 101 and a conductive structure external to the first die 101. In some embodiments, the first underfill 101e includes epoxy resin, epoxy molding compounds or etc.

In some embodiments, the molding 102 surrounds the first die 101. In some embodiments, the molding 102 is in contact with the sidewall 101c of the first die 101 and the first underfill 101e. In some embodiments, the second surface 101b of the first die 101 is exposed from the molding 102. In some embodiments, a surface of the molding 102 is coplanar with the second surface 101b of the first die 101. In some embodiments, the molding 102 can be a single layer film or a composite stack. In some embodiments, the molding 102 includes various materials, such as molding compound, molding underfill, epoxy, resin, or the like. In some embodiments, the molding 102 has a high thermal conductivity, a low moisture absorption rate and a high flexural strength.

In some embodiments, the via 103 extends through the molding 102. In some embodiments, the via 103 is surrounded by the molding 102. In some embodiments, the via 103 surrounds the first die 101. In some embodiments, an outer surface of the via 103 is in contact with the molding 102. In some embodiments, the via 103 includes a conductive material such as copper, silver, gold, aluminum, etc. In some embodiments, the via 103 is a through molding via (TMV). In some embodiments, a height of the via 103 is substantially same as a thickness of the molding 102.

In some embodiments, the interconnect structure 104 is disposed over or below the molding 102 and the first die 101. In some embodiments, the interconnect structure 104 re-routes a path from the first die 101 so as to redistribute I/O terminals of the first die 101 over the molding 102. In some embodiments, the interconnect structure 104 is a post passivation interconnection (PPI). In some embodiments, first die 101, the molding 102 and the via 103 are disposed over the interconnect structure 104. In some embodiments, the first connector 101d and the via 103 are electrically connected to the interconnect structure 104. In some embodiments, the molding 102 and the first underfill 101e are in contact with the interconnect structure 104.

In some embodiments, the interconnect structure 104 includes one or more dielectric layers 104a stacking over each other, and one or more conductive members 104b disposed within or surrounded by the dielectric layer(s) 104a. In some embodiments, the dielectric layer 104a is disposed over or below the first die 101 and the molding 102. In some embodiments, the dielectric layer 104a is disposed over or below the first surface 101a of the first die 101 and the molding 102. In some embodiments, the first connector 101d is disposed between the first die 101 and the dielectric layer 104a. In some embodiments, the molding 102 is in contact with the dielectric layer 104a. In some embodiments, the first underfill 101e is in contact with the dielectric layer 104a. In some embodiments, the dielectric layer 104a includes dielectric material such as silicon oxide, silicon nitride, silicon carbide, silicon oxynitride, polymer, polybenzoxazole (PBO), polyimide, benzocyclobutene (BCB), or the like.

In some embodiments, the conductive member 104b is disposed within the dielectric layer 104a. In some embodiments, the conductive member 104b is extended within the dielectric layer 104a. In some embodiments, the conductive member 104b is electrically connected to the via 103 and the first connector 101d. In some embodiments, the conductive member 104b includes conductive material such as gold, silver, copper, nickel, tungsten, aluminum, palladium and/or alloys thereof.

In some embodiments, the conductive member 104b includes a land portion 104b-1 and a via portion 104b-2 protruded from the land portion 104b-1. In some embodiments, the land portion 104b-1 is laterally extended in the dielectric layer 104a. In some embodiments, the land portion 104b-1 is electrically coupled with the via portion 104b-2. In some embodiments, the land portion 104b-1 is configured to receive or couple with a conductive structure. In some embodiments, the land portion 104b-1 is disposed over the dielectric layer 104a and electrically coupled with the via 103. In some embodiments, the land portion 104b-1 is electrically coupled with the first connector 101d and electrically connected to the first die 101 through the first connector 101d. In some embodiments, the land portion 104b-1 is a pad, a bond pad or the like.

In some embodiments, the via portion 104b-2 is vertically extended in the dielectric layer 104a. In some embodiments, the via portion 104b-2 is coupled with the land portion 104b-1. In some embodiments, the via portion 104b-2 is electrically connected to the via 103, the first connector 101d or the first die 101.

In some embodiments, the second die 105 is disposed over the molding 102. In some embodiments, the second die 105 is exposed from the molding 102. In some embodiment, the second die 105 is entirely exposed. In some embodiments the second die 105 is disposed over the molding 102 and the via 103. In some embodiments, no molding 102 is disposed between the first die 101 and the second die 105. In some embodiments, a width of the first die 101 is substantially greater than a width of the second die 105. In some embodiments, a thickness of the second die 105 is substantially greater than a thickness of the first die 101.

In some embodiments, the second die 105 is fabricated with a predetermined functional circuit within the second die 105. In some embodiments, the second die 105 is singulated from a semiconductive wafer by a mechanical or laser blade. In some embodiments, the second die 105 comprises a variety of electrical circuits suitable for a particular application. In some embodiments, the electrical circuits include various devices such as transistors, capacitors, resistors, diodes and/or the like. In some embodiments, the second die 105 comprises of any one of various known types of semiconductor devices such as memories (such as DRAM, SRAMS, flash memories, etc.), or the like. In some embodiments, the second die 105 is a high bandwidth memory (HBM) die, or the like. In some embodiments, the second die 105 is central processing unit (CPU) memory or graphics processing unit (GPU) memory. In some embodiments, the second die 105 has 8 channels, and each channel has a width of 128 bits. In some embodiments, the second die 105 has a total width of 1024 bits. In some embodiments, the second die 105 has a bandwidth of substantially greater than about 100 Gigabytes per second (GB/s). In some embodiments, the second die 105 is a die, a chip or a package. In some embodiments, the second die 105 has a top cross section (a cross section from a top view of the semiconductor structure 100 as shown in FIG. 1) in a quadrilateral, a rectangular or a square shape.

In some embodiments, the second die 105 includes a substrate which comprises semiconductive materials such as silicon. In some embodiments, the substrate of the second die 105 includes several circuitries and electrical components disposed thereon. In some embodiments, the substrate of the second die 105 is a silicon substrate.

In some embodiments, the second die 105 includes a third surface 105a, a fourth surface 105b opposite to the third surface 105a, and a sidewall 105c between the third surface 105a and the fourth surface 105b. In some embodiments, the third surface 105a is a front side or active side of the second die 105. In some embodiments, the fourth surface 105b is a back side or inactive side of the second die 105. In some embodiments, the sidewall 105c is substantially orthogonal to the third surface 105a and the fourth surface 105b. In some embodiments, the sidewall 105c is vertically extended between the third surface 105a and the fourth surface 105b. In some embodiments, the third surface 105a, the fourth surface 105b and the sidewall 105c of the second die 105 are exposed. In some embodiments, the third surface 105a, the fourth surface 105b and the sidewall 105c of the second die 105 are exposed from the molding 102.

In some embodiments, the second die 105 is disposed over the first die 101. In some embodiments, the second die 105 is disposed above the first die 101. In some embodiments, the second die 105 is at least partially overlapped with the first die 101. In some embodiments, an edge of the second die 105 is disposed over an edge of the first die 101. In some embodiments, the second die 105 is disposed over at least a portion of the second surface 101b of the first die 101.

In some embodiments, a second connector 105d is disposed over or below the second die 105. In some embodiments, the second connector 105d is disposed over or below the third surface 105a of the second die 105. In some embodiments, the second connector 105d is protruded from the second die 105. In some embodiments, the second connector 105d is electrically connected to a circuitry in the second die 105. In some embodiments, the second connector 105d is configured to couple with a circuitry or a conductive structure external to the second die 105. In some embodiments, the second connector 105d is disposed over and coupled with the via 103. In some embodiments, the second connector 105d is electrically connected to the via 103. In some embodiments, the second die 105 is electrically connected to the conductive member 104b through the second connector 105d and the via 103. In some embodiments, the first die 101 is electrically connected to the second die 105 through the first connector 101d, the conductive member 104b, the via 103 and the second connector 105d. In some embodiments, the second die 105 is a dummy die and is electrically isolated from the via 103 or the conductive member 104b. In some embodiments, the second connector 105d is not electrically connected to the via 103 or the conductive member 104b.

In some embodiments, the second connector 105d includes conductive material such as includes solder, copper, nickel, gold or etc. In some embodiments, the second connector 105d is a conductive bump, a solder ball, a ball grid array (BGA) ball, controlled collapse chip connection (C4) bump, microbump, a pillar, a post or the like. In some embodiments, the second connector 105d is in a spherical, hemispherical or cylindrical shape.

In some embodiments, a second underfill 105e surrounds the second connector 105d and partially surround the second die 105. In some embodiments, the second underfill 105e is in contact with the third surface 105a, the sidewall 105c of the second die 105 and the second connector 105d. In some embodiments, a portion of the sidewall 105c of the second die 105 is covered by the second underfill 105e, and a portion of the sidewall 105c of the second die 105 is exposed from the second underfill 105e. In some embodiments, the second underfill 105e fills gap between the second connectors 105d. In some embodiments, the second underfill 105e is in contact with the molding 102, the first die 101 or the via 103. In some embodiments, the second underfill 105e is disposed over the second surface 101b of the first die 101. In some embodiments, the second underfill 105e is an electrically insulated adhesive for securing a bonding between the second die 105 and a conductive structure external to the second die 105. In some embodiments, the second underfill 105e includes epoxy resin, epoxy molding compounds or etc.

In some embodiments, a first conductive bump 106 is disposed over or below the interconnect structure 104. In some embodiments, the first conductive bump 106 is disposed over or below the conductive member 104b. In some embodiments, the first conductive bump 106 is disposed over or below the land portion 104b-1. In some embodiments, the first conductive bump 106 is protruded from the interconnect structure 104. In some embodiments, the first conductive bump 106 is electrically connected to the conductive member 104b or the land portion 104b-1.

In some embodiments, the first conductive bump 106 is configured to couple with a circuitry or a conductive structure. In some embodiments, the first conductive bump 106 includes conductive material such as includes solder, copper, nickel, gold or etc. In some embodiments, the first conductive bump 106 is a conductive bump, a solder ball, a ball grid array (BGA) ball, controlled collapse chip connection (C4) bump, microbump, a pillar, a post or the like. In some embodiments, the first conductive bump 106 is in a spherical, hemispherical or cylindrical shape.

In some embodiments, a substrate 108 is disposed over or below the interconnect structure 104. In some embodiments, the substrate 108 is fabricated with a predetermined functional circuit thereon. In some embodiments, the substrate 108 includes several conductive traces and several electrical components such as transistor, diode, etc. disposed within the substrate 108. In some embodiments, the substrate 108 includes semiconductive material such as silicon, germanium, gallium, arsenic, or combinations thereof. In some embodiments, the substrate 108 includes material such as ceramic, glass, polymer or the like. In some embodiments, the substrate 108 is a silicon substrate. In some embodiments, the substrate 108 is a printed circuit board (PCB). In some embodiments, the substrate 108 has a quadrilateral, rectangular, square, polygonal or any other suitable shape.

In some embodiments, the substrate 108 includes a fifth surface 108a and a sixth surface 108b opposite to the fifth surface 108a. In some embodiments, the fifth surface 108a faces to the first conductive bump 106 and the interconnect structure 104. In some embodiments, the first conductive bump 106 is disposed between the interconnect structure 104 and the substrate 108. In some embodiments, the first conductive bump 106 is disposed between the dielectric layer 104a and the fifth surface 108a of the substrate 108.

In some embodiments, the substrate 108 includes a bond pad 108c disposed over the substrate 108. In some embodiments, the bond pad 108c is disposed over the fifth surface 108a of the substrate 108. In some embodiments, the bond pad 108c is configured to receive a conductive structure. In some embodiments, the bond pad 108c is electrically connected to a circuitry in the substrate 108. In some embodiments, the first conductive bump 106 is bonded with the bond pad 108c. In some embodiments, the first conductive bump 106 is disposed over the bond pad 108c to electrically connect to the substrate 108. In some embodiments, the substrate 108 is electrically connected to the first die 101 through the bond pad 108c, the first conductive bump 106, the conductive member 104b and the first connector 101d. In some embodiments, the substrate 108 is electrically connected to the second die 105 through the bond pad 108c, the first conductive bump 106, the conductive member 104b, the via 103 and the second connector 105d. In some embodiments, the bond pad 108c includes conductive material such as gold, silver, copper, nickel, tungsten, aluminum, palladium and/or alloys thereof.

In some embodiments, a third underfill 107 is disposed between the interconnect structure 104 and the substrate 108. In some embodiments, the third underfill 107 is disposed over the fifth surface 108a of the substrate 108. In some embodiments, the third underfill 107 surrounds the first conductive bump 106 and a portion of the dielectric layer 104a. In some embodiments, the third underfill 107 is in contact with a sidewall of the dielectric layer 104a, the first conductive bump 106 and the fifth surface 108a of the substrate 108. In some embodiments, a portion of the dielectric layer 104a is exposed from the third underfill 107. In some embodiments, the third underfill 107 fills gap between the first conductive bumps 106. In some embodiments, the third underfill 107 is an electrically insulated adhesive for securing a bonding between the interconnect structure 104 and the substrate 108. In some embodiments, the third underfill 107 includes epoxy resin, epoxy molding compounds or etc.

In some embodiments, a second conductive bump 109 is disposed over or below the substrate 108. In some embodiments the second conductive bump 109 is disposed over or below the sixth surface 108b of the substrate 108. In some embodiments, the second conductive bump 109 is protruded from the substrate 108. In some embodiments, the second conductive bump 109 is electrically connected to a circuitry in the substrate 108. In some embodiments, the second conductive bump 109 is configured to couple with a circuitry or a conductive structure. In some embodiments, the second conductive bump 109 is configured to bond over another substrate or package and to electrically connect a circuitry of the substrate 108 with a circuitry of another substrate or package.

In some embodiments, the second conductive bump 109 includes conductive material such as includes solder, copper, nickel, gold or etc. In some embodiments, the second conductive bump 109 is a conductive bump, a solder ball, a ball grid array (BGA) ball, controlled collapse chip connection (C4) bump, microbump, a pillar, a post or the like. In some embodiments, the second conductive bump 109 is in a spherical, hemispherical or cylindrical shape.

Figure 3:
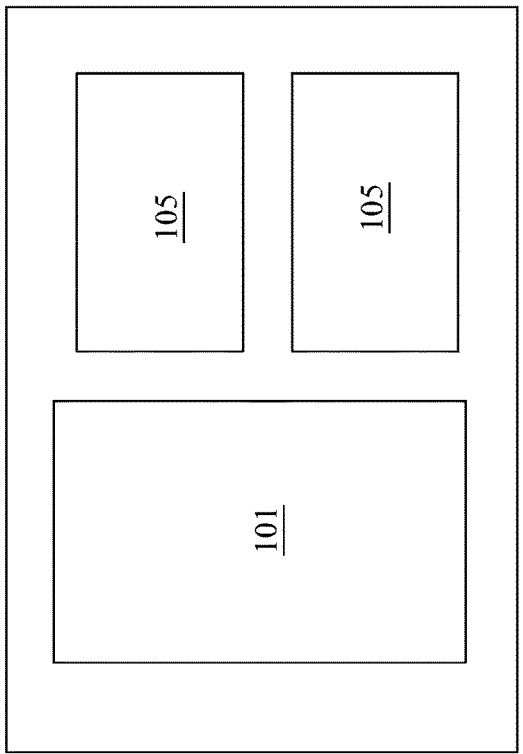
FIGS. 2-5 are schematic top cross sectional views of dies of the semiconductor structure in various arrangements.
Figure 5:
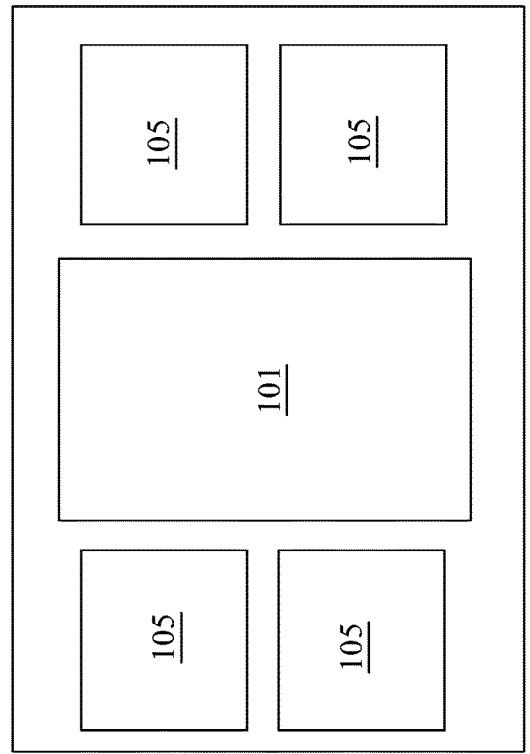
Figure 2:
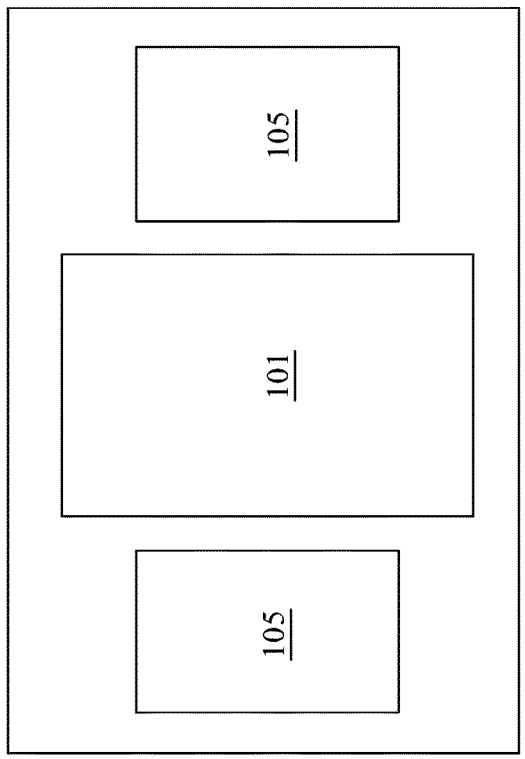
Figure 4:
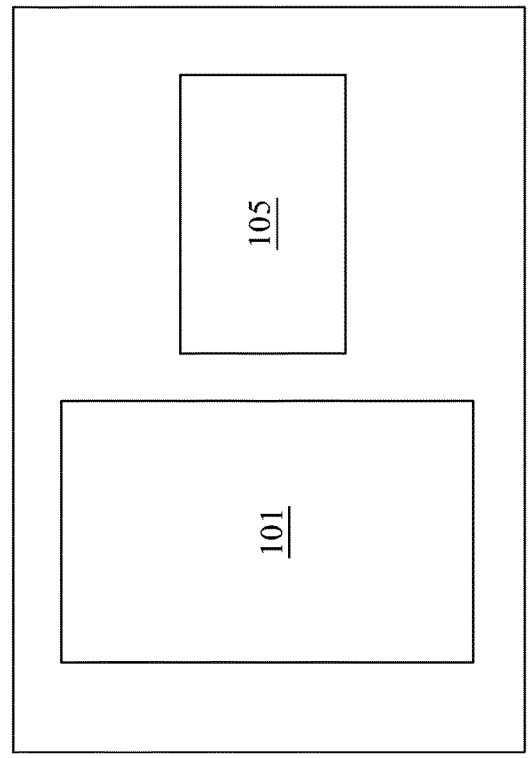

FIGS. 2-5 show schematic cross sectional top views of the semiconductor structure 100 illustrating various arrangements of the first die 101 and the second die 105. In some embodiments as shown in FIGS. 2, 3 and 5, the second dies 105 are in symmetric arrangement. In some embodiments as shown in FIG. 2, the semiconductor structure 100 includes one first die 101 and two second dies 105 surrounding the first die 101. In some embodiments as shown in FIG. 3, the two second dies 105 are disposed opposite to the first die 101. In some embodiments as shown in FIG. 4, the second die 105 is disposed opposite to the first die 101. In some embodiments as shown in FIG. 5, four second dies 105 surround the first die 101.

Figure 6:
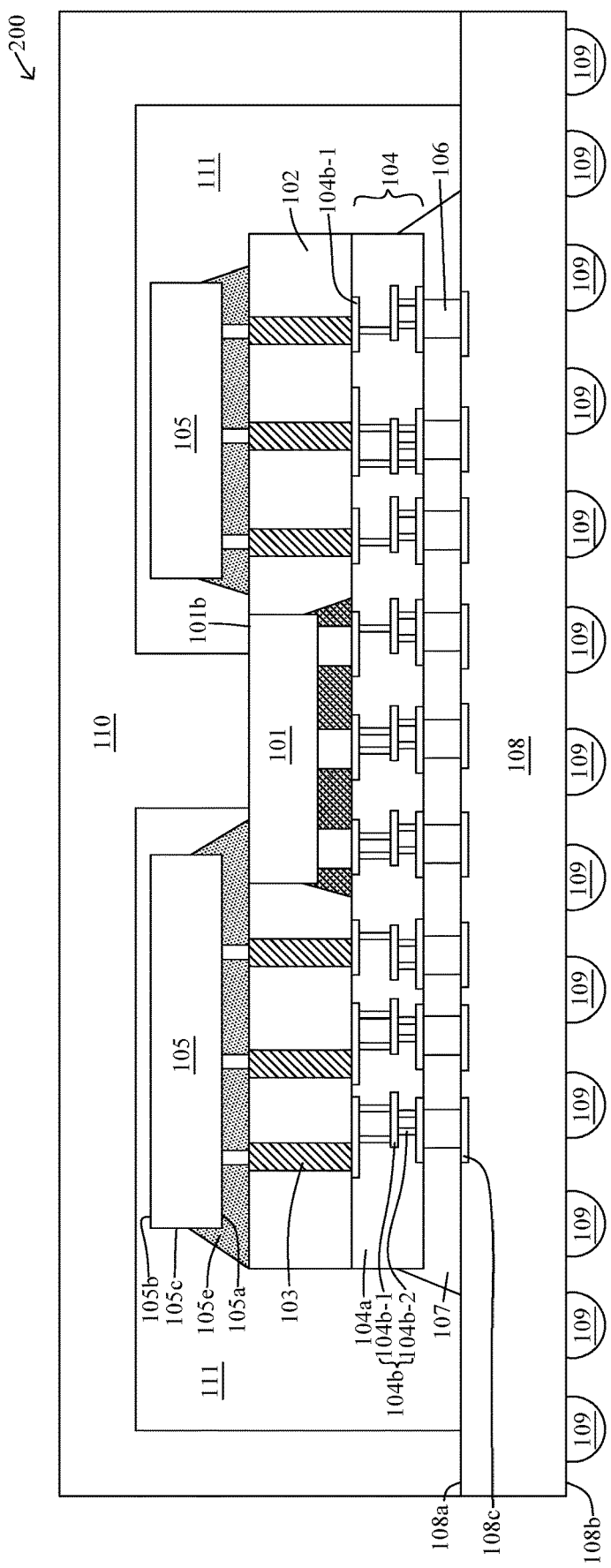
FIG. 6 is a schematic cross sectional view of a semiconductor structure in accordance with some embodiments of the present disclosure.

FIG. 6 is a schematic cross sectional view of a semiconductor structure 200 in accordance with various embodiments of the present disclosure. In some embodiments, the semiconductor structure 200 includes the first die 101, the molding 102, the via 103, the interconnect structure 104 and the second die 105, which have similar configurations as those described above or illustrated in FIGS. 1-5.

Figure 7:
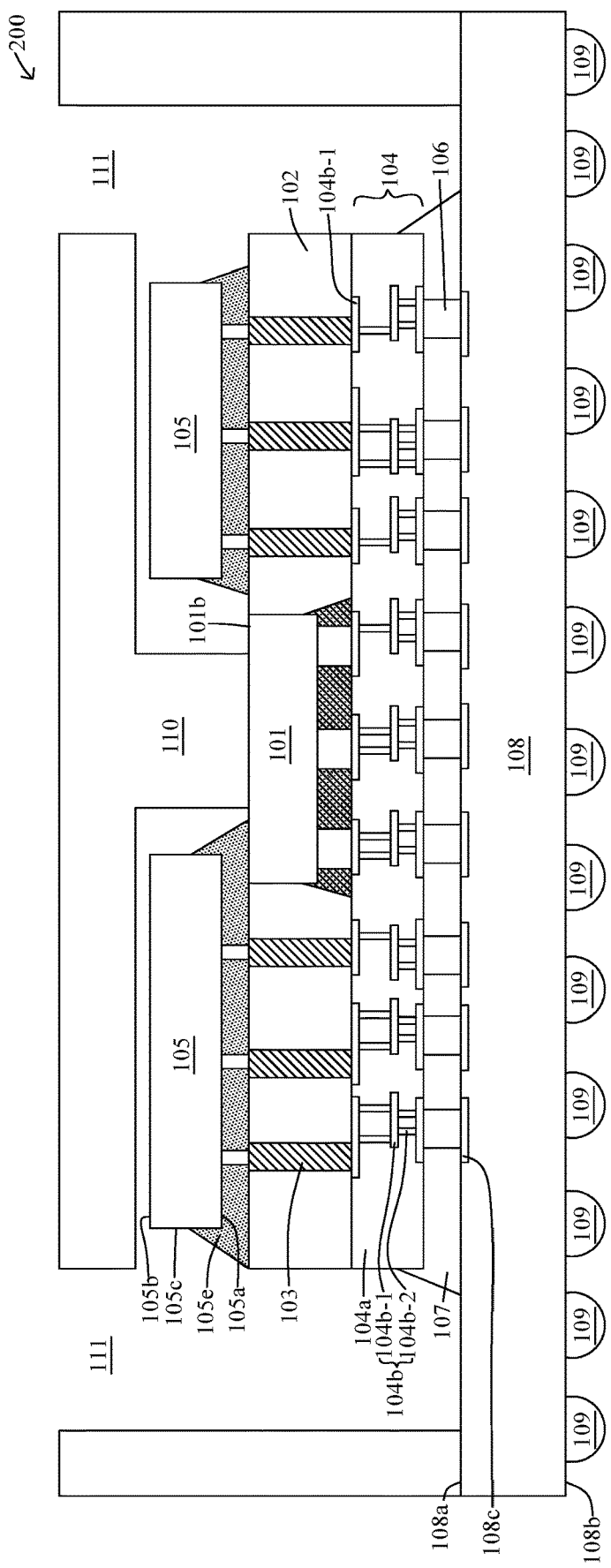
FIG. 7 is a schematic cross sectional view of a semiconductor structure in accordance with some embodiments of the present disclosure.

In some embodiments, the semiconductor structure 200 includes a lid 110 disposed over the substrate 108, the first die 101 and the second die 105. In some embodiments, the lid 110 is disposed over the second surface 101b of the first die 101. In some embodiments, the lid 110 is attached to the substrate 108. In some embodiments, the lid 110 is in contact with the first die 101. In some embodiments, the lid 110 is configured to dissipate a heat from the first die 101 to an ambient environment. In some embodiments, the lid 110 includes thermally conductive material such as aluminum, copper or etc. In some embodiments, the lid 110 is a heat sink or a heat spreader. In some embodiments, a void 111 is disposed between the lid 110 and the second die 105, the molding 102, the interconnect structure 104 or the substrate 108. In some embodiments as shown in FIG. 7, the lid 110 includes several separated portions contacting with the first die 101 or the substrate 108.

Figure 8:
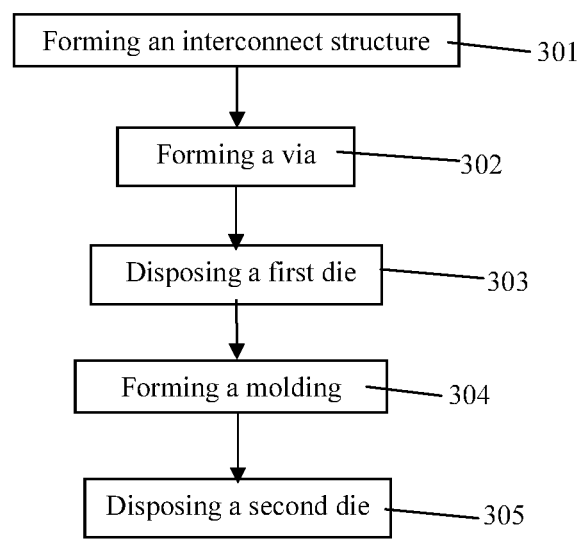
FIG. 8 is a flow diagram of a method of manufacturing a semiconductor structure in accordance with some embodiments of the present disclosure.

In the present disclosure, a method of manufacturing a semiconductor structure 100 is also disclosed. In some embodiments, a semiconductor structure 100 is formed by a method 300. The method 300 includes a number of operations and the description and illustration are not deemed as a limitation as the sequence of the operations. FIG. 8 is an embodiment of the method 300 of manufacturing the semiconductor structure 100. The method 300 includes a number of operations (301, 302, 303, 304 and 305).

Figure 8A:
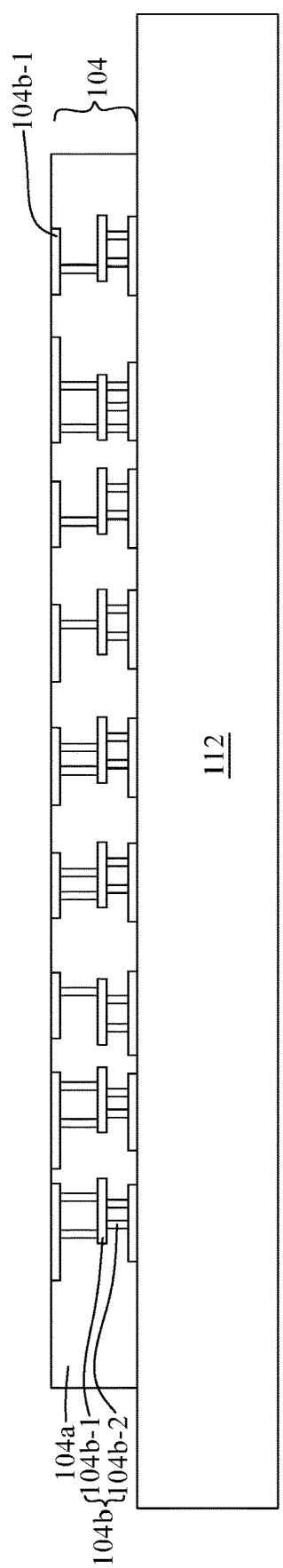
FIGS. 8A-8I are schematic views of manufacturing a semiconductor structure by a method of FIG. 8 in accordance with some embodiments of the present disclosure.

In operation 301, an interconnect structure 104 is formed as shown in FIG. 8A. In some embodiments, a carrier 112 is provided, and the interconnect structure 104 is formed over the carrier 112. In some embodiments, a carrier 112 is provided for temporarily supporting components subsequently disposed thereon. In some embodiments, the carrier 112 is a substrate or a wafer. In some embodiments, the carrier 112 includes silicon, glass, ceramic or the like.

In some embodiments, the interconnect structure 104 includes a dielectric layer 104a and a conductive member 104b disposed within the dielectric layer 104a. In some embodiments, the interconnect structure 104 is formed by disposing the dielectric layer 107a over the carrier 112, removing some portions of the dielectric layer 104a to form some recesses, and disposing a conductive material into the recesses to form the conductive member 104b within the dielectric layer 104a. In some embodiments, the conductive member 104b includes a land portion 104b-1 and a via portion 104b-2 protruded and coupled with the land portion 104b-1. In some embodiments, the land portion 104b-1 is laterally extended in the dielectric layer 104a, the via portion 104b-2 is vertically extended in the dielectric layer 104a. In some embodiments, the interconnect structure 104, the dielectric layer 104a, the conductive member 104b, the land portion 104b-1 and the via portion 104b-2 have similar configuration as those described above or illustrated in any of FIGS. 1-7.

In some embodiments, the dielectric layer 104a is disposed by spin coating, chemical vapor deposition (CVD) or any other suitable operations. In some embodiments, the portions of the dielectric layer 104a are removed by photolithography, etching or any other suitable operations. In some embodiments, the conductive material is disposed by sputtering, electroplating or any other suitable operations.

Figure 8B:
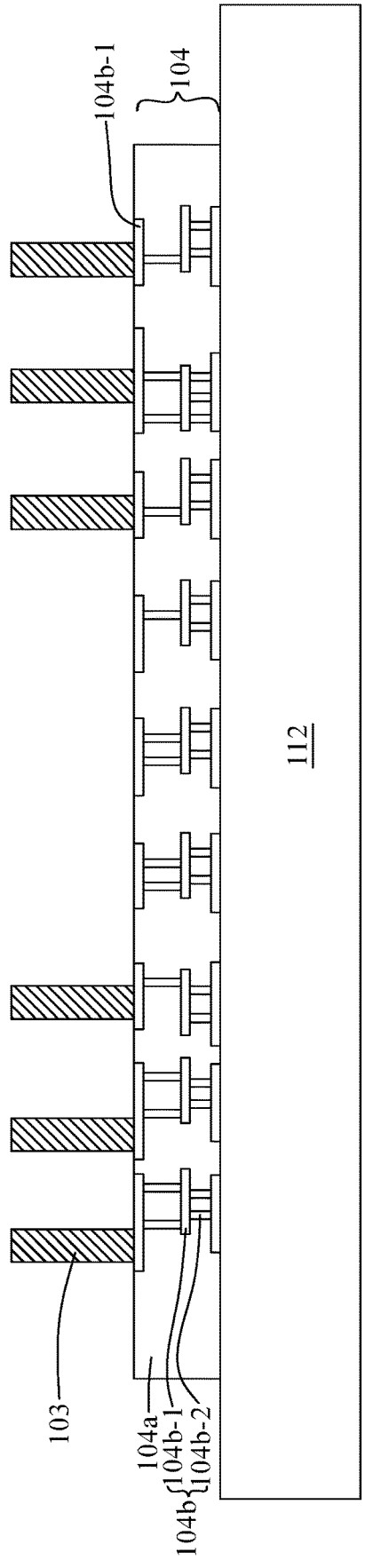

In operation 302, a via 103 is formed as shown in FIG. 8B. In some embodiments, the via 103 is formed over the interconnect structure 104. In some embodiments, the via 103 is disposed over the conductive member 104b. In some embodiments, the via 103 is disposed over the land portion 104b-1. In some embodiments, the via 103 is extended from the interconnect structure 104. In some embodiments, the via 103 has similar configuration as those described above or illustrated in any of FIGS. 1-7.

In some embodiments, the via 103 is formed by disposing a photoresist over the interconnect structure 104, patterning the photoresist to form an opening, and disposing a conductive material into the opening to form the via 103, and then removing the photoresist. In some embodiments, the disposing of the conductive material includes sputtering, electroplating or any other suitable operations. In some embodiments, the conductive material includes copper, silver, gold, aluminum, etc. In some embodiments, the photoresist is disposed by spin coating or any other suitable operations. In some embodiments, the photoresist is removed by etching, stripping or any other suitable operations.

Figure 8C:
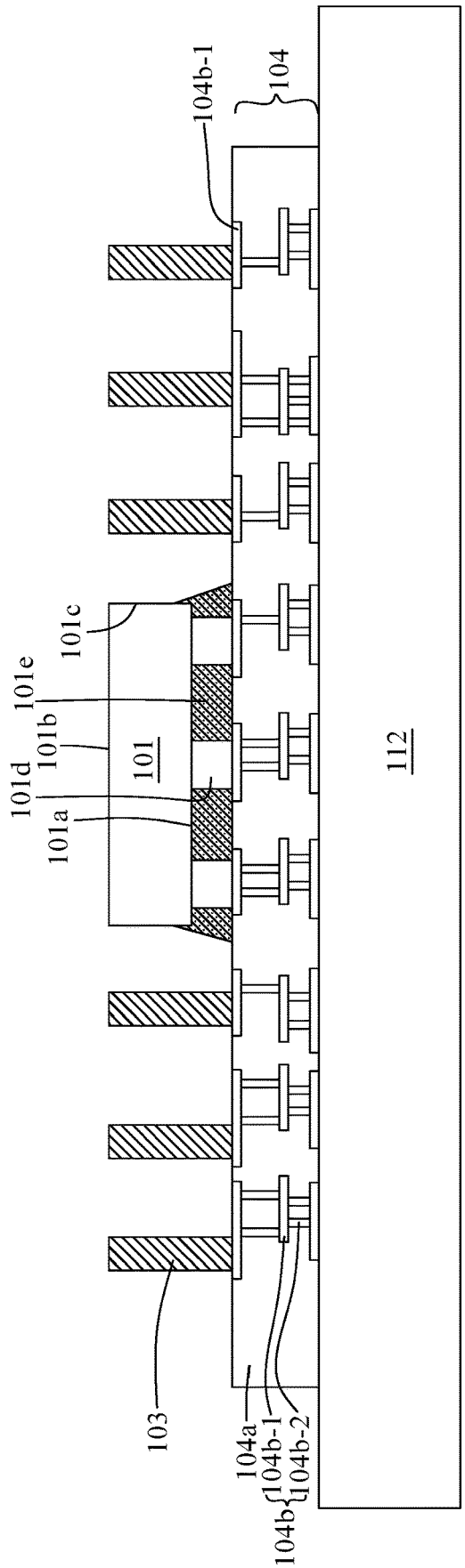

In operation 303, a first die 101 is disposed as shown in FIG. 8C. In some embodiments, the first die 101 is disposed over the interconnect structure 104. In some embodiments, the first die 101 is disposed adjacent to the via 103. In some embodiments, the first die 101 includes a first surface 101a facing to the interconnect structure 104, a second surface 101b opposite to the first surface 101a, and a sidewall 101c between the first surface 101a and the second surface 101b. In some embodiments, the first die 101 is a logic device die or the like. In some embodiments, the first die 101 has configuration similar to the one described above or illustrated in any of FIGS. 1-7.

In some embodiments, the first die 101 is bonded with the conductive member 104b by a first connector 101d. In some embodiments, the first connector 101d is bonded with the land portion 104b-1. In one embodiment, the first die 101 is electrically connected to the conductive member 104b through the first connector 101d.

In some embodiments, a first underfill 101e is disposed between the first die 101 and the interconnect structure 104 to surround the first connector 101d as shown in FIG. 8C. In some embodiments, the first underfill 101e surrounds a portion of the first die 101. In some embodiments, a portion of the sidewall 101c of the first die 101 is covered by the first underfill 101e. In some embodiments, the first underfill 101e fills gap between adjacent first connectors 101d. In some embodiments, the first underfill 101e is disposed by flowing, injection or any other suitable operations. In some embodiments, the first connector 101d and the first underfill 101e have configuration similar to those described above or illustrated in any of FIGS. 1-7.

Figure 8D:
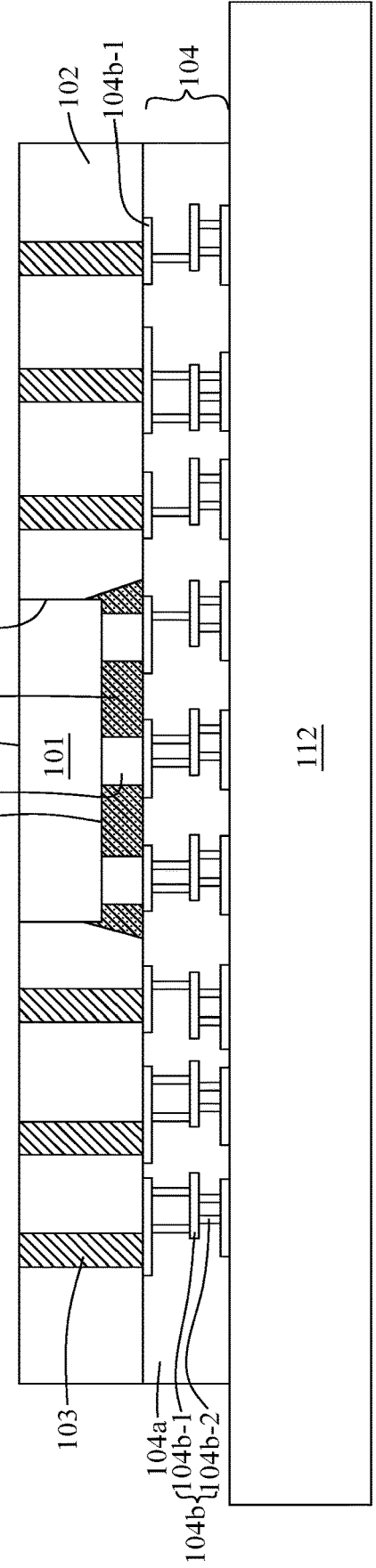

In operation 304, a molding 102 is formed as shown in FIG. 8D. In some embodiments, the molding 102 is formed over the interconnect structure 104 and around the first die 101 and the via 103. In some embodiments, the via 103 is extended through the molding 102. In some embodiments, the molding 102 is formed by transfer molding, injection molding or any other suitable operations. In some embodiments, the second surface 101b of the first die 101 is exposed from the molding 102. In some embodiments, the molding 102 is ground to expose the second surface 101*b* of the first die 101. In some embodiments, the molding 102 is ground by grinding, planarization, chemical mechanical polish (CMP) or any other suitable operations. In some embodiments, the molding 102 has configuration similar to the one described above or illustrated in any of FIGS. 1-7.

Figure 8E:
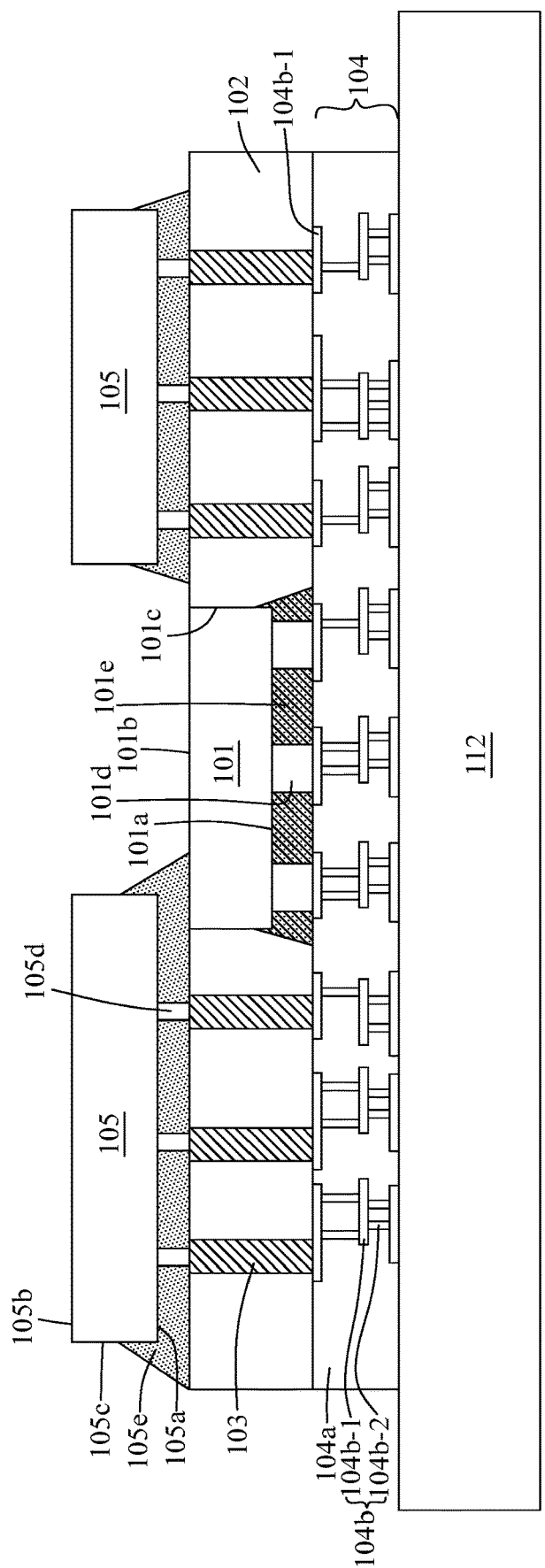

In operation 305, a second die 105 is disposed as shown in FIG. 8E. In some embodiments, the second die 105 is disposed over the molding 102. In some embodiments, the second die 105 is disposed over the via 103. In some embodiments, the second die 105 is disposed over at least a portion of the first die 101. In some embodiments, the second die 105 is at least partially overlapped with the first die 101. In some embodiments, the second die 105 includes a third surface 105*a* facing to the molding 102, a fourth surface 105*b* opposite to the third surface 105*a*, and a sidewall 105*c* between the third surface 105*a* and the fourth surface 105*b*. In some embodiments, the second die 105 is a HBM die or the like. In some embodiments, the second die 105 has configuration similar to the one described above or illustrated in any of FIGS. 1-7.

In some embodiments, the second die 105 is bonded with the via 103 by a second connector 105*d* as shown in FIG. 8E. In some embodiment, the second die 105 is electrically connected to the conductive member 104*b* through the second connector 105*d*. In some embodiments, the second die 105 is electrically connected to the first die 101 through the second connector 105*d*, the via 103, the conductive member 104*b* and the first connector 101*d*.

In some embodiments, a second underfill 105*e* is disposed between the second die 105 and the molding 102 to surround the second connector 105*d* as shown in FIG. 8E. In some embodiments, the second underfill 105*e* surrounds a portion of the second die 105. In some embodiments, a portion of the sidewall 105*c* of the second die 105 is covered by the second underfill 105*e*. In some embodiments, the second underfill 105*e* fills gap between adjacent second connectors 105*d*. In some embodiments, the second underfill 105*e* is disposed by flowing, injection or any other suitable operations. In some embodiments, the second connector 105*d* and the second underfill 105*e* have configuration similar to those described above or illustrated in any of FIGS. 1-7.

Figure 8F:
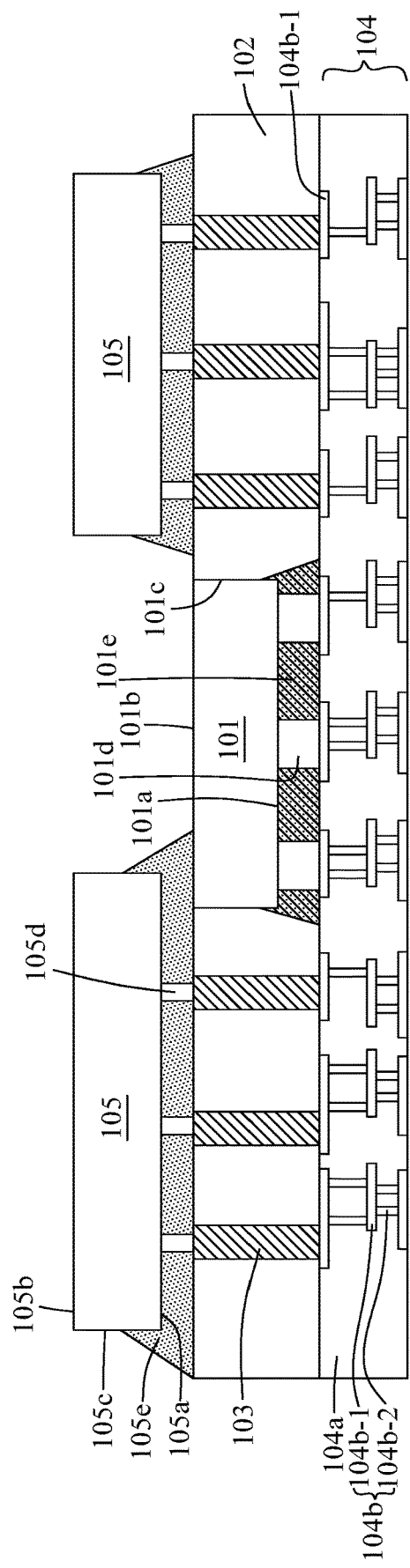

In some embodiments, the carrier 112 is removed as shown in FIG. 8F. In some embodiments, the carrier 112 is removed after the disposing the second die 105 or the second underfill 105*e*. In some embodiments, the carrier 112 is debonded from the interconnect structure 104 or the dielectric layer 104*a*.

Figure 8G:
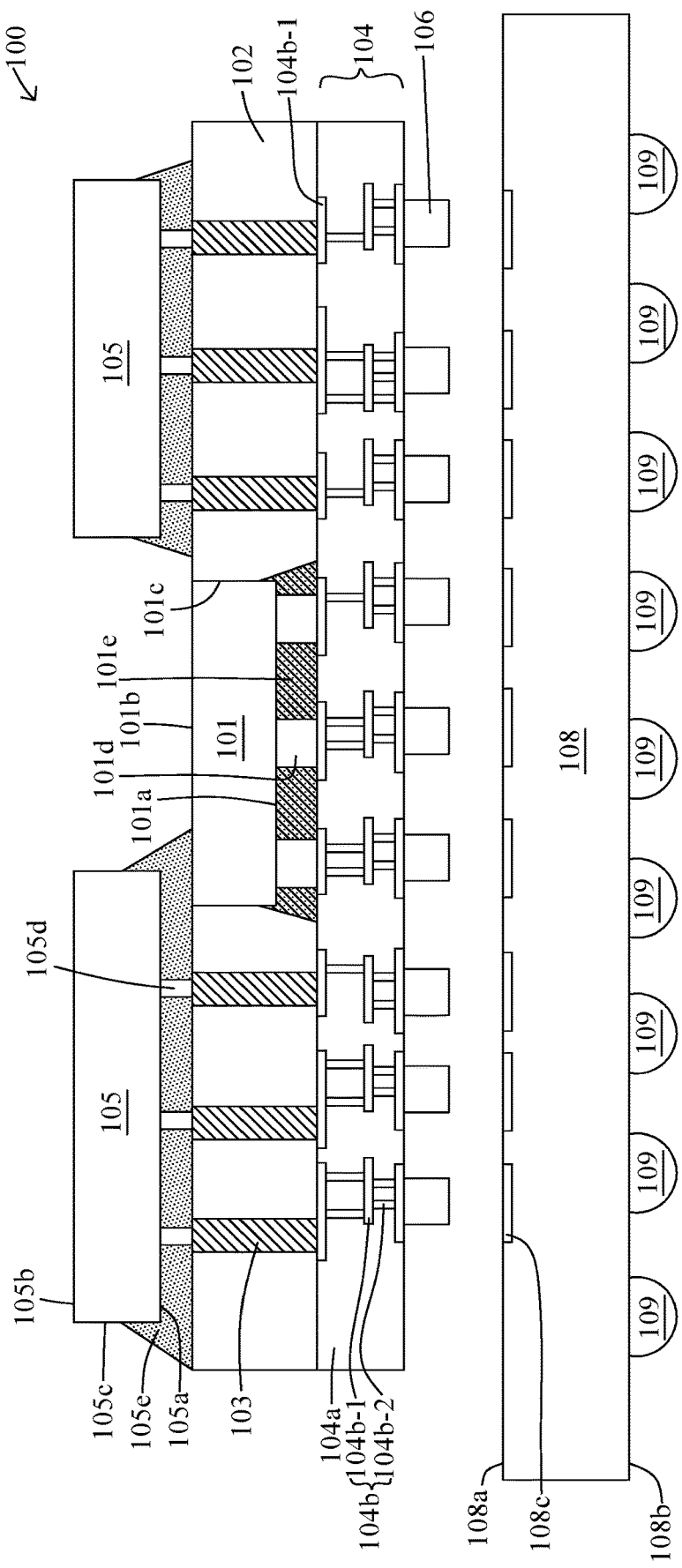

In some embodiments, a substrate 108 is received or provided as shown in FIG. 8G. In some embodiments, the substrate 108 is a silicon substrate. In some embodiments, the substrate 108 is a printed circuit board (PCB). In some embodiments, the substrate 108 includes a fifth surface 108*a* and a sixth surface 108*b* opposite to the fifth surface 108*a*. In some embodiments, the substrate 108 includes a bond pad 108*c* disposed over the fifth surface 108*a* of the substrate 108. In some embodiments, the substrate 108 has configuration similar to the one described above or illustrated in any of FIGS. 1-7.

In some embodiments, a first conductive bump 106 is disposed over the interconnect structure 104 as shown in FIG. 8G. In some embodiments, the first conductive bump 106 is disposed over the conductive member 104*b* or the land portion 104*b*-1. In some embodiments, the first conductive bump 106 is configured to bond over another substrate or package and to electrically connect a circuitry of the substrate 108 with a circuitry of another substrate or package. In some embodiments, the first conductive bump 106 is a solder joint, a solder bump, a solder ball, a ball grid array (BGA) ball, a controlled collapse chip connection (C4) bump, microbump, a conductive pillar, post or the like. In some embodiments, the first conductive bump 106 has configuration similar to the one described above or illustrated in any of FIGS. 1-7.

Figure 8H:
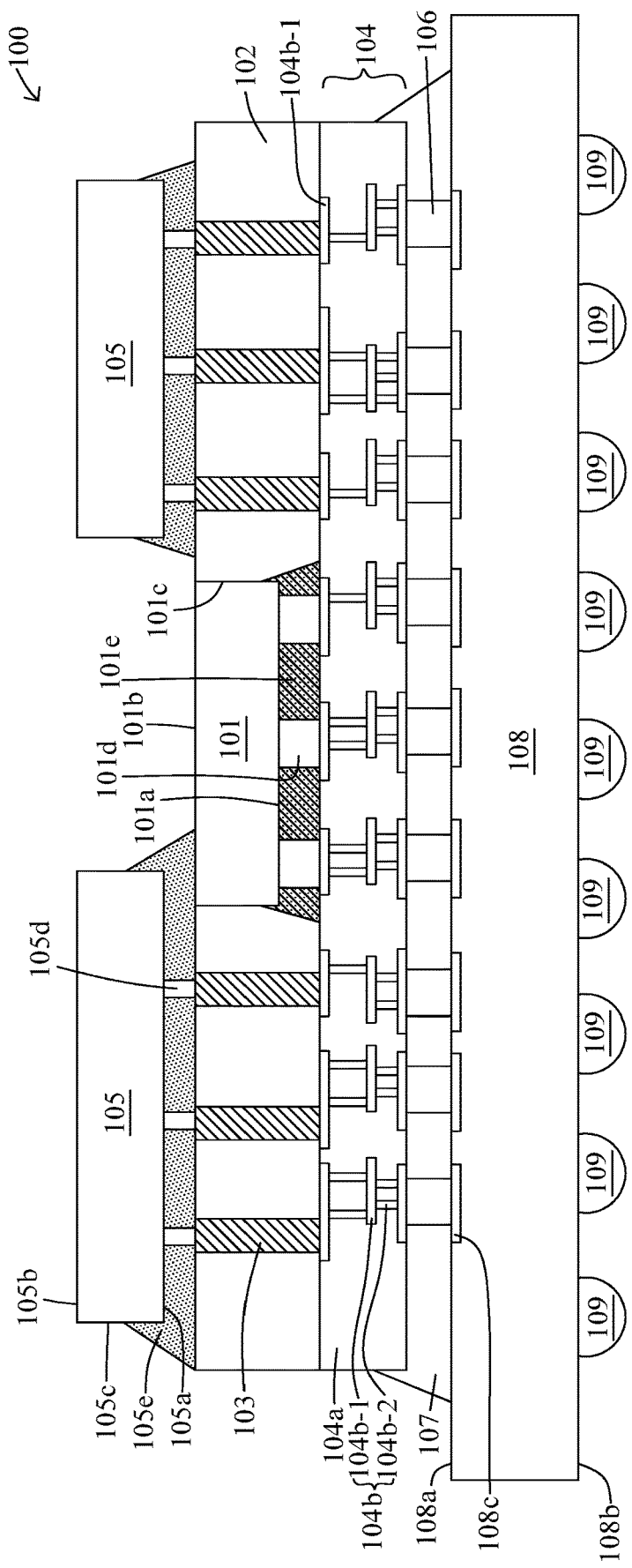
Figure 8I:
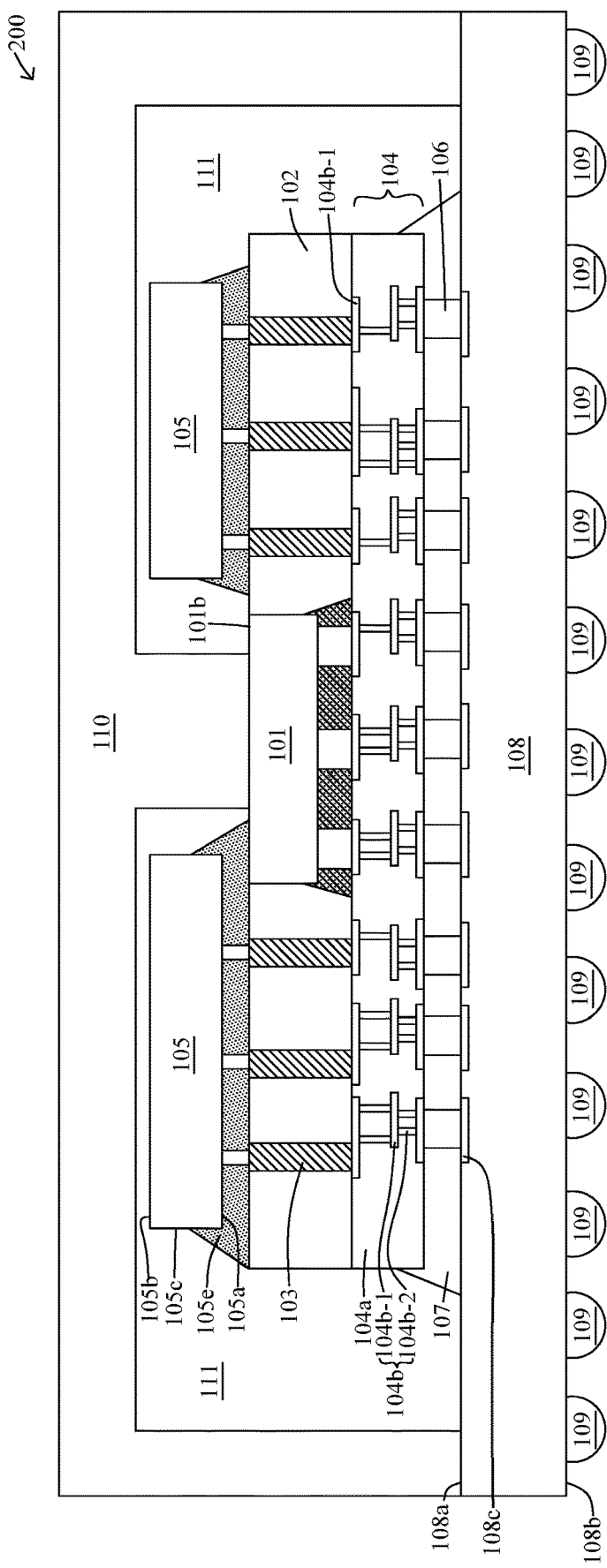

In some embodiments, the first conductive bump 106 is bonded with the bond pad 108*a* of the substrate 108 as shown in FIG. 8H. In some embodiments, the first conductive bump 106 is disposed between the interconnect structure 104 and the substrate 108. In some embodiments, the substrate 108 is electrically connected to the conductive member 104*b* through the bond pad 108*c* and the first conductive bump 106. In some embodiments, the first die 101 and the second die 105 are electrically connected to the substrate 108 through the first connector 101*d*, the second connector 105*d*, the via 103, the conductive member 104*b* and the first conductive bump 106.

In some embodiments, a third underfill 107 surrounds a portion of the interconnect structure 104 as shown in FIG. 8H. In some embodiments, a portion of the dielectric layer 104*a* is covered by the third underfill 107. In some embodiments, the third underfill 107 is disposed between the interconnect structure 104 and the substrate 108 around the first conductive bump 106. In some embodiments, the third underfill 107 fills gap between adjacent first conductive bump 106. In some embodiments, the third underfill 107 is disposed by flowing, injection or any other suitable operations. In some embodiments, the third underfill 107 has configuration similar to the one described above or illustrated in any of FIGS. 1-7.

In some embodiments, a second conductive bump 109 is disposed over the sixth surface 108*b* of the substrate 108 as shown in FIG. 8H. In some embodiments, the second conductive bump 109 is disposed by ball dropping, solder pasting, stencil printing or other suitable operations. In some embodiments, the second conductive bump 109 is a solder joint, a solder bump, a solder ball, a ball grid array (BGA) ball, a controlled collapse chip connection (C4) bump, microbump, a conductive pillar, post or the like. In some embodiments, the second conductive bump 109 has similar configuration as the one described above or illustrated in any of FIGS. 1-7. In some embodiments, a semiconductor structure 100 is formed which has similar configuration as the one in FIG. 1.

In some embodiments, a lid 110 is formed over the first die 101, the second die 105 and the substrate 108. In some embodiments, the lid 110 is in contact with the first die 101 and configured to dissipate heat from the first die 101 to the surrounding. In some embodiments, the lid 110 is attached to the substrate 108. In some embodiments, the lid 110 is formed by press molding or any other suitable operations, and then placed over and contacted with the first die 101. In some embodiments, the lid 110 has similar configuration as the one described above or illustrated in FIG. 6 or 7. In some embodiments, a semiconductor structure 200 is formed which has similar configuration as the one in FIG. 6 or 7.

In the present disclosure, a semiconductor structure is disclosed. The semiconductor structure includes a first die disposed over an interconnect structure, a molding surrounding the first die, a second die disposed over the first die and the molding, and a via extended through the molding to electrically connect the first die with the second die. As such, electrical communication speed between the first die and the second die can be increased, operation power can be decreased, and an overall dimension of the semiconductor structure can be minimized.

In some embodiments, a semiconductor structure is provided. The semiconductor structure includes a first die, a molding at least partially surrounding the first die, a via extended through the molding, a second die disposed over the molding, a connector dispose between the second die and the via, and an underfill at least partially surrounding the connector. The first die includes a first surface and a second surface opposite to the first surface. The second die includes a third surface facing the first die, a fourth surface opposite to the third surface, and a sidewall between the third surface and the fourth surface. The connector is in contact with the third surface of the second die and the via. In some embodiments, the second die is electrically connected to the via. In some embodiments, the underfill covers a portion of the sidewall of the second die and a portion of the second surface of the first die.

In some embodiments, the second die overlaps a portion of the first die. In some embodiments, the underfill is in contact with a portion of the molding. In some embodiments, the first die is disposed adjacent to the via. In some embodiments, the semiconductor structure further includes an interconnect structure, wherein the first die, the molding and the via are dispose between the interconnect structure and the second die. In some embodiments, the second die is electrically connected to the interconnect structure through the connector and the via.

In some embodiments, a semiconductor structure is provided. The semiconductor structure includes a first die, a molding at least partially surrounding the first die, a via extended through the molding, a second die disposed over the molding and the first die, and a lid disposed over the first die and the second die. The second die is electrically connected to the via. In some embodiments, the lid is separated from the second die, and a portion of the lid is in contact with the first die.

In some embodiments, the semiconductor structure further includes a connector dispose between the second die and the via, and a first underfill disposed over the molding and surrounding the connector, wherein the first underfill is in contact with a portion of the first die, a portion of the molding and a portion of a sidewall of the second die. In some embodiments, the semiconductor structure further includes a substrate, an interconnect structure disposed between the substrate and the first die and between the substrate and the molding, and a first conductive bump disposed between the interconnect structure and the substrate. In some embodiments, the substrate has a surface facing the interconnect structure, and the lid is in contact with a portion of the surface of the substrate. In some embodiments, the semiconductor structure further includes a second conductive bump disposed over a surface of the substrate opposite to the surface facing the interconnect structure. In some embodiments, the lid includes a first portion in contact with the first die, a second portion in contact with the substrate, and the first portion and the second portion are separated from each other. In some embodiments, the semiconductor structure further includes a second underfill disposed between the interconnect structure and the substrate and surrounding the first conductive bump. In some embodiments, the lid is separated from the second underfill.

In some embodiments, a semiconductor structure is provided. The semiconductor structure includes an interconnect structure, a first die disposed over the interconnect structure, a molding disposed over the interconnect structure and at least partially surrounding the first die, a via extended through the molding and electrically connected to the interconnect structure, a second die disposed over the first die and the molding, a first connector disposed between the first die and the interconnect structure, a second connector disposed between the second die and the via, a first underfill at least partially surrounding the first connector, and a second underfill at least partially surrounding the second connector. In some embodiments, the second underfill covers a portion of a sidewall of the second die and exposes a portion of the sidewall of the second die.

In some embodiments, the first underfill is in contact with a portion of a sidewall of the first die, and the second underfill is in contact with a portion of a sidewall of the second die. In some embodiments, the second underfill is in contact with a portion of the first die and a portion of the molding. In some embodiments, the first die is electrically connected to the interconnect structure through the first connector, and the second die is electrically connected to the interconnect structure through the second connector and the via. In some embodiments, the semiconductor structure further includes a substrate having a first surface facing the interconnect structure and a second surface opposite to the first surface, a first conductive bump disposed on the first surface of the substrate and electrically connecting the substrate to the interconnect structure, and a second conductive bump disposed on the second surface of the substrate. In some embodiments, the semiconductor structure further includes a third underfill surrounding the first conductive bump, wherein the third underfill is in contact with a portion of the first surface of the substrate and a portion of a sidewall of the interconnect structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor structure, comprising:
   a first die including a first surface and a second surface opposite to the first surface;
   a molding at least partially surrounding the first die;
   a via extended through the molding and in contact with the molding;
   a second die disposed over the molding and including a third surface facing the first die, a fourth surface opposite to the third surface and a sidewall between the third surface and the fourth surface;
   a connector disposed between the second die and the via and being in contact with the third surface of the second die and the via; and
   an underfill at least partially surrounding the connector, wherein the second die is electrically connected to the via, and the underfill covers a portion of the sidewall of the second die and a portion of the second surface of the first die.

2. The semiconductor structure of claim 1, wherein the second die overlaps a portion of the first die.

3. The semiconductor structure of claim 1, wherein the underfill is in contact with a portion of the molding.

4. The semiconductor structure of claim 1, wherein the first die is disposed adjacent to the via.

5. The semiconductor structure of claim 1, further comprising an interconnect structure, wherein the first die, the molding and the via are disposed between the interconnect structure and the second die.

6. The semiconductor structure of claim 5, wherein the second die is electrically connected to the interconnect structure through the connector and the via.

7. A semiconductor structure, comprising:
a substrate:
a first die;
a molding at least partially surrounding the first die;
a via extended through the molding;
an interconnect structure disposed between the substrate and the first die and between the substrate and the molding;
a first conductive bump disposed between the interconnect structure and the substrate;
a second die disposed over the molding and the first die, and electrically connected to the via; and
a lid disposed over the first die and the second die, wherein the lid is separated from the second die, and a portion of the lid is in contact with the first die, wherein the substrate has a surface facing the interconnect structure and the lid is in contact with a portion of the surface of the substrate.

8. The semiconductor structure of claim 7, further comprising:
a connector disposed between the second die and the via; and
a first underfill disposed over the molding and surrounding the connector, wherein the first underfill is contact with a portion of the first die, a portion of the molding and a portion of a sidewall of the second die.

9. The semiconductor structure of claim 7, further comprising a second conductive bump disposed over a surface of the substrate opposite to the surface facing the interconnect structure.

10. The semiconductor structure of claim 7, wherein the lid comprises a first portion in contact with the first die, a second portion in contact with the substrate, and the first portion and the second portion are separated from each other.

11. The semiconductor structure of claim 10, wherein a top surface of the first portion of the lid and a top surface of the second portion of the lid are aligned.

12. The semiconductor structure of claim 7, further comprising a second underfill disposed between the interconnect structure and the substrate and surrounding the first conductive bump.

13. The semiconductor structure of claim 12, wherein the lid is separated from the second underfill.

14. The semiconductor structure of claim 7, wherein the lid comprises a first portion in contact with the first die, a second portion in contact with the substrate, and the first portion and the second portion are coupled to each other.

15. The semiconductor structure of claim 7, wherein the via is in contact with the molding.

16. A semiconductor structure, comprising:
an interconnect structure;
a substrate having a first surface facing the interconnect structure and a second surface opposite to the first surface;
a first conductive bump disposed on the first surface of the substrate and electrically connecting the substrate and the interconnect structure;
a second conductive bump disposed on the second surface of the substrate;
a first die disposed over the interconnect structure;
a molding disposed over the interconnect structure and at least partially surrounding the first die;
a via extended through the molding and electrically connected to the interconnect structure;
a second die disposed over the first die and the molding;
a first connector disposed between the first die and the interconnect structure;
a second connector disposed between the second die and the via;
a first underfill at least partially surrounding the first connector;
a second underfill at least partially surrounding the second connector; and
a third underfill surrounding the first conductive bump, wherein the third underfill is in contact with a portion of the first surface of the substrate and a portion of a sidewall of the interconnect structure,
wherein the second underfill covers a portion of a sidewall of the second die and exposes another portion of the sidewall of the second die.

17. The semiconductor structure of claim 16, wherein the first underfill is in contact with a portion of a sidewall of the first die, and the second underfill is in contact with a portion of a sidewall of the second die.

18. The semiconductor structure of claim 16, wherein the second underfill is in contact with a portion of the first die and a portion of the molding.

19. The semiconductor structure of claim 16, wherein the first die is electrically connected to the interconnect structure through the first connector, and the second die is electrically connected to the interconnect structure through the second connector and the via.

20. The semiconductor structure of claim 16, wherein the via is in contact with the molding.

* * * * *